United States Patent [19]
Kito et al.

[11] Patent Number: 5,874,027
[45] Date of Patent: Feb. 23, 1999

[54] BORON-CARBON SYSTEM SUPERCONDUCTIVE SUBSTANCE

[75] Inventors: Hijiri Kito; Shozo Ikeda; Hideki Abe; Hideaki Kitazawa; Takehiko Matsumoto, all of Ibaraki, Japan

[73] Assignee: National Research Institute for Metals, Ibaraki, Japan

[21] Appl. No.: 810,289

[22] Filed: Mar. 3, 1997

[30] Foreign Application Priority Data

Mar. 25, 1996 [JP] Japan .................................... 8-066964

[51] Int. Cl.⁶ ............................ H01B 12/00; H01L 39/12
[52] U.S. Cl. .................................... 252/520.5; 252/521.1; 252/521.2; 252/521.4; 252/521.5; 505/801; 505/810
[58] Field of Search ..................................... 505/100, 801, 505/810; 427/62; 252/506, 516, 520.5, 521.1, 521.2, 521.4, 521.5

[56] References Cited

PUBLICATIONS

Fuji et al, Jpn. J. Appl. Phys. vol. 33, Part 2, No. 4B, pp. L590–L593, 1994.
Nagarajan et al, Physical Review Letters, vol. 72, No.2, Jan. 1994, pp. 274–277.
Felner, J. Magn. Magn. Mater. 157/158 (European Magnetic Materials and Applications Conference, 1995) pp. 622–623, 1996.

*Primary Examiner*—Roy V. King
*Attorney, Agent, or Firm*—Wenderoth, Lind & Ponack, L.L.P.

[57] ABSTRACT

A new boron-carbon system superconductive substance has a nominal composition expressed $R_3M_{4-x}B_{4-y}C_{3-z}$ (where R is at least one element selected from the group consisting of Y, Sc and lanthanide series elements, M is at least one metal element categorized in VIII group of periodic table, and $0 \leq x \leq 1, 0 \leq y \leq 1, 0 \leq z < 3$, except a case of x=y=1 and z=0).

16 Claims, 6 Drawing Sheets scale |———|
10nm $Y_1Ni_2B_2C_1$    $Y_1Ni_3B_1C_1$    $Y_3Ni_4B_4C_3$

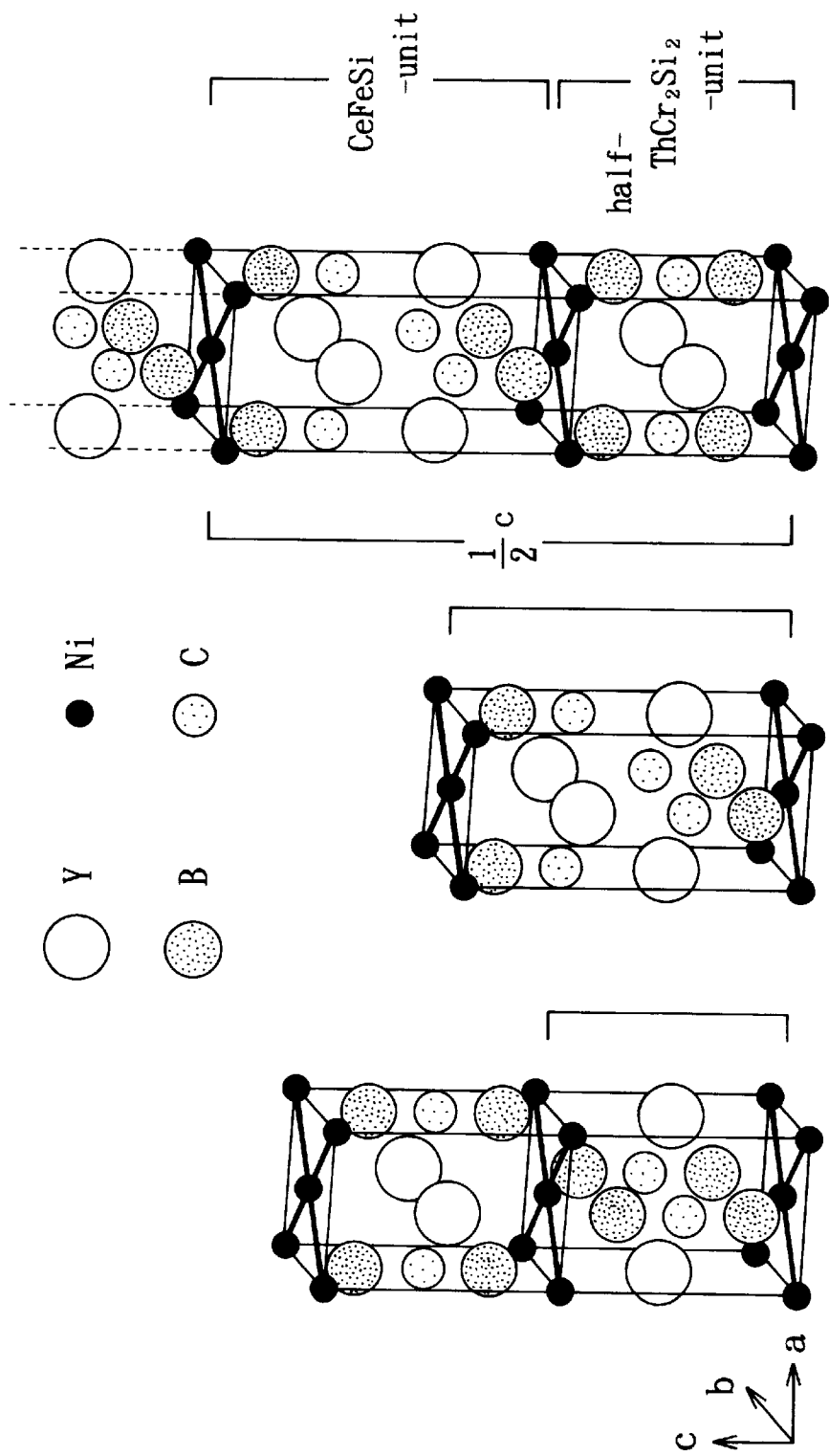
Fig. 5(a) Y₁Ni₂B₂C₁ ThCr₂Si₂ type
Fig. 5(b) Y₁Ni₁B₁C₁ CeFeSi type
Fig. 5(c) Y₃Ni₄B₄C₃

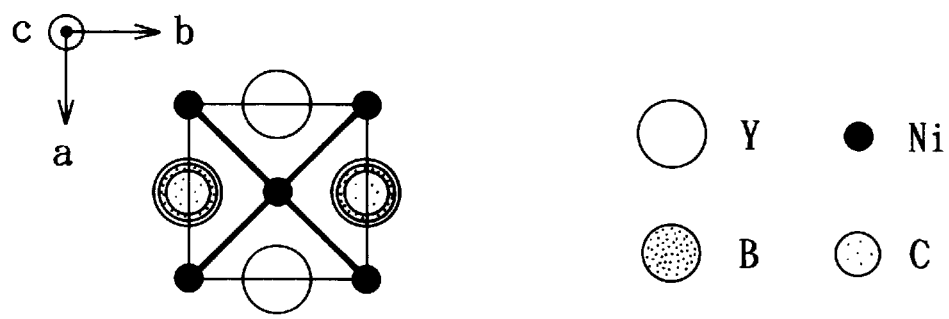
Fig. 6(a)
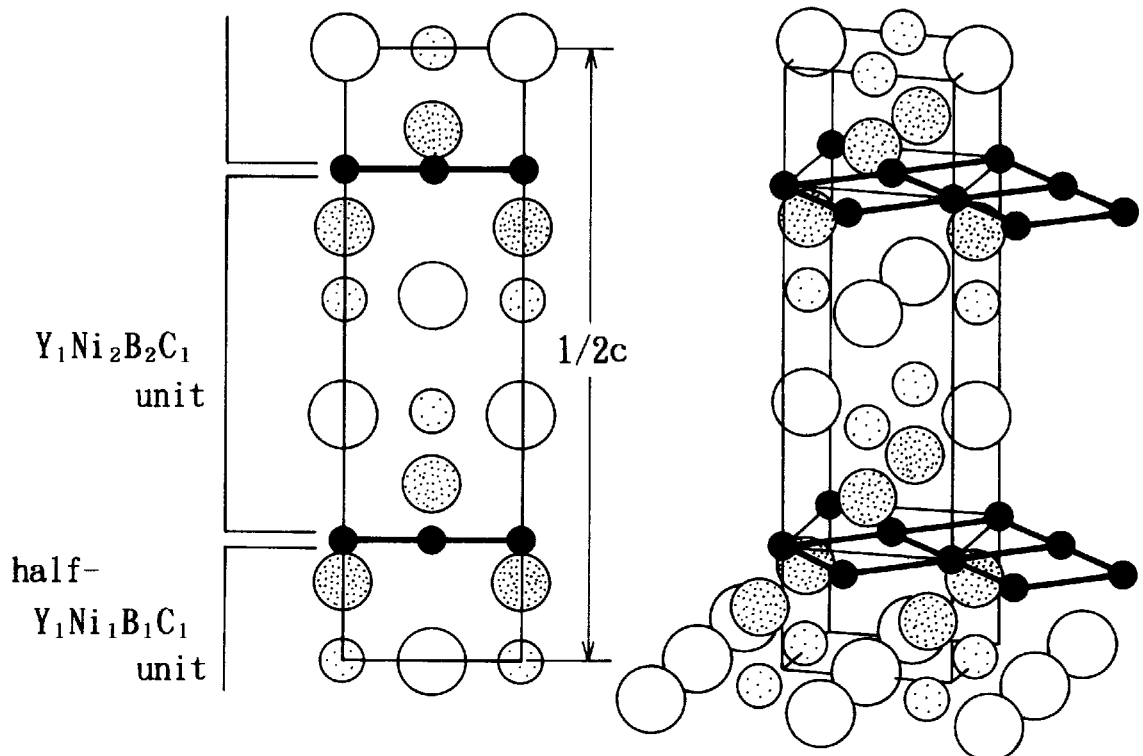
Fig. 6(b)
Fig. 6(c)

BORON-CARBON SYSTEM SUPERCONDUCTIVE SUBSTANCE

FIELD OF THE INVENTION

The present invention relates to boron-carbon system superconductive substances. More particularly, the present invention relates to new superconductive substances of boron-carbon system, which are hopeful superconductive substances for superconductive magnets, Josephson devices or magnetic shields, and to superconductors made thereof.

DESCRIPTION OF THE RELATED ART

It has been expected that superconductive phenomenon would be developed into a wide range of technological fields such as a strong electric field involving superconductive magnets and electric power storage, cryogenic electronic materials for Josephson devices or SQUIDs, or sheet materials for magnetic shields.

An intermetallic compound superconductor such as Nb—Ti system, $Nb_3Sn$ or $V_3Ge$ has been already applied to several trials by using liquid helium for a coolant. Recently, a copper oxide superconductor such as $YBa_2Cu_3O_{7+\delta}$ or $Bi_2Sr_2CaCu_2O_{8+\delta}$ has been studied for its practical use.

Under such circumstances, superconductivity of boron, carbon or boron-carbon compounds was found out and has been attracted.

However, the superconductivity of an intermetallic compound superconductor consisting of boron carbide is not sufficient, and an annealing process for a long time is necessitated for improving its superconductivity.

In addition, several boron carbide superconductive substances generally lack in thermodynamic stability so that it is difficult to make wires and thin films which are able to put such substances to practical uses.

SUMMARY OF THE INVENTION

The present invention has an object to provide superconductive substances having a new composition, which is different from that of conventional intermetallic or oxide superconductors, and superconductors made thereof, which can break through the difficulty in application of boron carbide superconductors to a wide range of technological fields.

This and other objects, features and advantages will be more apparent by reading the following specification and accompanied drawings.

BRIEF DESCRIPTION OF THE DRAWINGS

FIGS. 5($a$), 5($b$) and 5($c$) are schematic views illustrating crystalline structures of $Y_1Ni_2B_2C_1$, $Y_1Ni_1B_1C_1$ and $Y_3Ni_4B_4C_3$, respectively; and FIGS. 6($a$), 6($b$) and 6($c$) are schematic views illustrating a crystalline structure of $Y_3Ni_4B_4C_3$, especially illustrating it in the direction of c-axis.

DETAILED DESCRIPTION OF THE INVENTION

The present invention provides a superconductive substance having a nominal composition expressed $R_3M_{4-x}B_{4-y}C_{3-z}$ (where R is at least one element selected from the group consisting of Y, Sc and rare earth elements, M is at least one element categorized in VIII group of periodic table, and $0 \leq x \leq 1$, $0 \leq y \leq 1$, $0 \leq z \leq 3$, except a case of x=y=1 and z=0).

One preferred embodiment is that M is more than one element selected from the group consisting of Ni, Pd, Pt, Rh and Ir. Another preferred embodiment is that the superconductive substance has a tetragonal or rhombic crystalline structure. Further another preferred embodiment is that a crystal of the superconductive substance has lattice constants of a is 0.34 to 0.40 nm b is 0.34 to 0.40 nm and c is 2.500 to 2.620 nm or 1.250 to 1.310 nm.

The present invention also provides, as one preferred embodiment, a superconductor such as a composite compound or a shaped product, which comprises at least a superconductive substance described in the above.

In the present invention, "R" expressed in the aforementioned composition represents Y, Sc and rare earth elements. Rare earth elements contain La, Ce, Pr, Nd, Sm, Eu, Gd, Tb, Dy, Ho, Er, Tm, Yb, and Lu. Ni, Pd, Pt, Rh and Ir are exemplified for "M".

"R" and "M" represent more than one element listed in the above.

Boron-Carbon superconductive substances are easily produced by an arc melt method under atmospheric pressure, for example. These substances are so stable in thermodynamic property that they are considered to be easily applied to wires or thin films for practical use.

These substances are hopeful ones for application to a wide range of technological fields such as electric power or electronic devices. The substances also have an advantage in that they are composed of elements such as rare earth elements and transition metals, which are relatively inexpensive and are easily purchased in the market.

EXAMPLES

Metal bulks of Y and Ni, and B and C powders as starting materials were weighed so as to realize a composition of $Y_3Ni_4B_4C_3$. These raw materials were formed into cylinder-like pellets, each of which was 1 cm in diameter and about 1 mm in thickness.

These pellets were put on a hearth and were melt through an arc melt method under argon atmosphere.

Fragmentary specimens, each of which was about 1 mm in width and about 6 mm in length, were cut out of button-shaped materials obtained from the melt. Temperature dependency of electric conduction was measured for these fragmentary specimens. A part of the button-shaped materials were, on the other hand, pulverized. For these powders, temperature dependency of susceptibility was measured by SQUID, and X-ray powder diffraction and observation with an X-ray microscope were also conducted.

Figure 1:
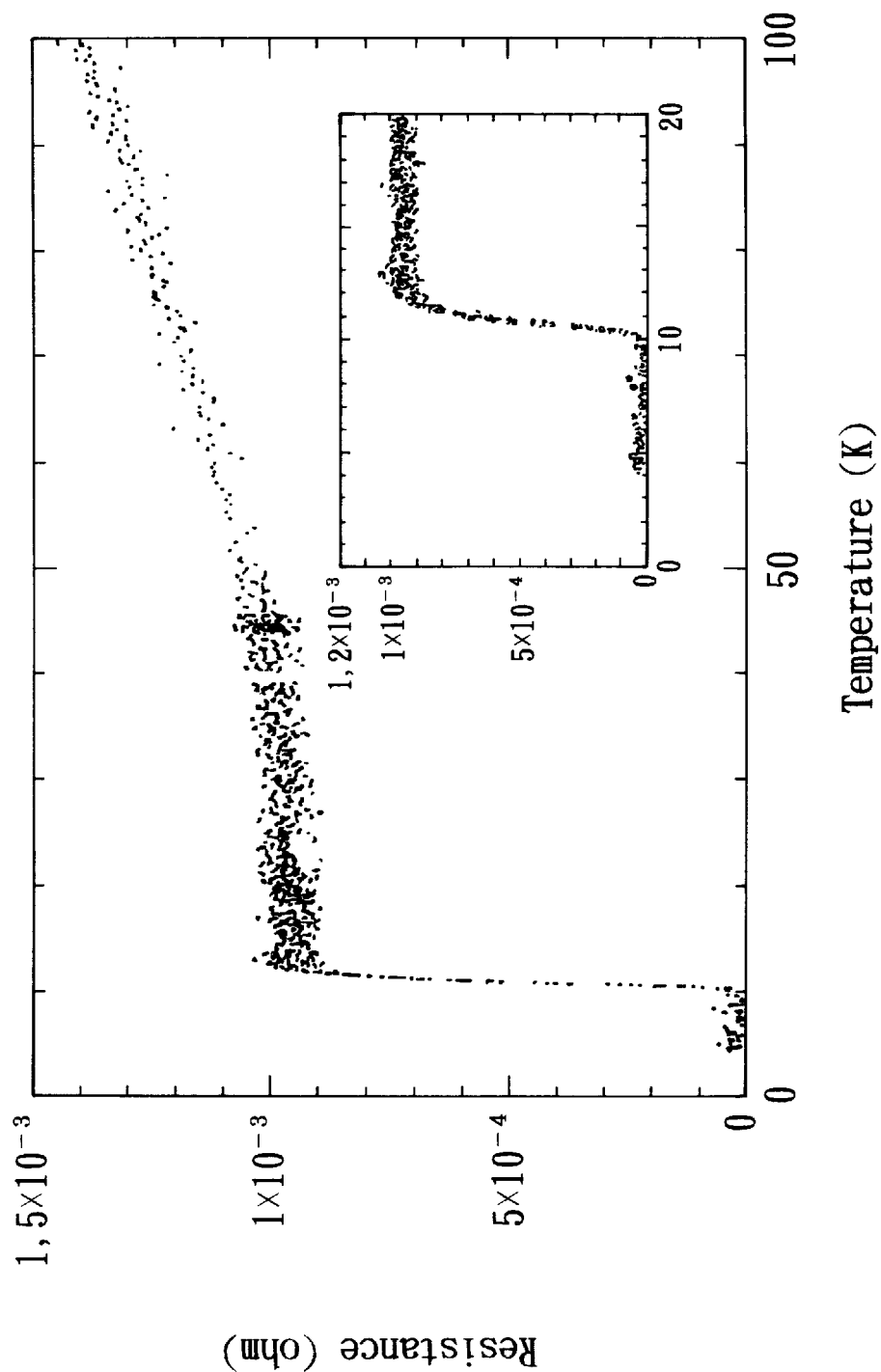
FIG. 1 is a graph depicting temperature dependency of electric conduction.
Figure 2:
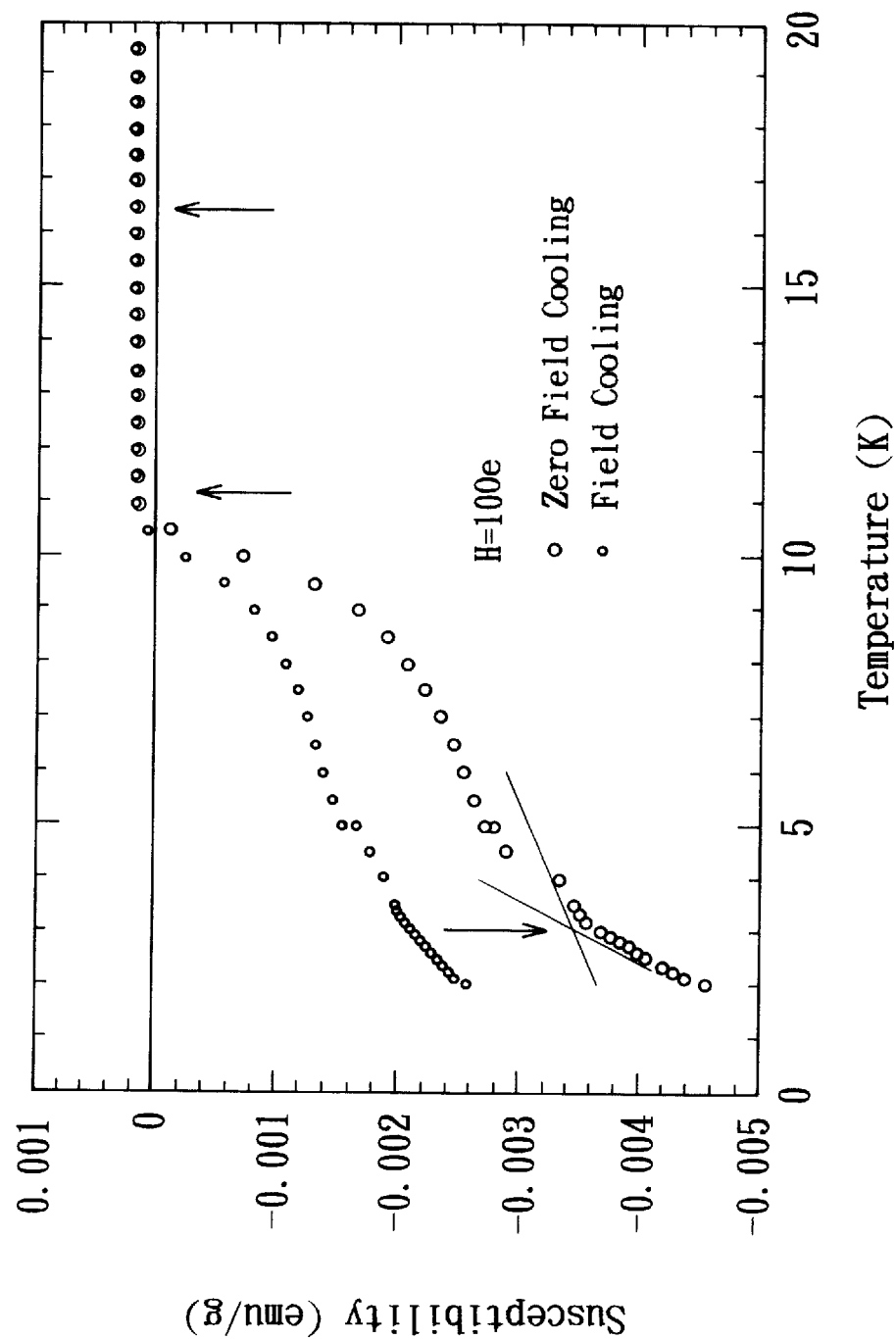
FIG. 2 is a graph depicting temperature dependency of susceptibility.
Figure 3:
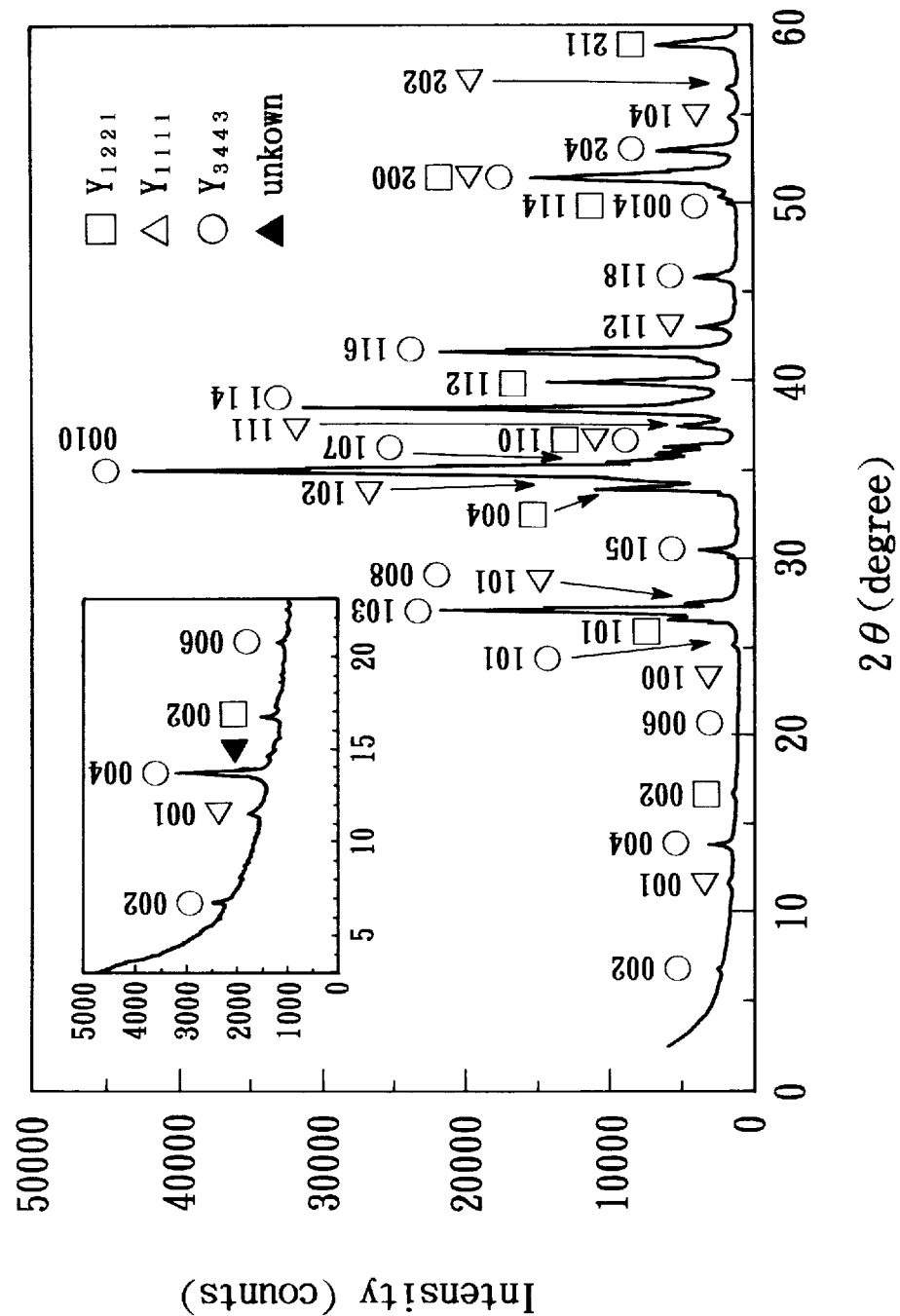
FIG. 3 is an X-ray powder diffraction pattern.

As shown in FIG. 1, transition temperature $T_C$ is 11.5K. As seen in FIG. 2, there is a new phase, which shows complete diamagnetism at 11.5K, except conventional $Y_1Ni_2B_2C_1$ ($T_C$=about 16.5K) and $Y_1Ni_1B_1C_1$ ($T_C$=about 3 K). It is considered from volume percentages of Meissner effect and the result of X-ray powder diffraction (FIG. 3) that superconductivity of the substance produced derives from the $Y_3Ni_4B_4C_3$ main phase. Meissner diamagnetism at 5 K was around 20% during zero field cooling, but around 12% during field cooling.

Figure 4:
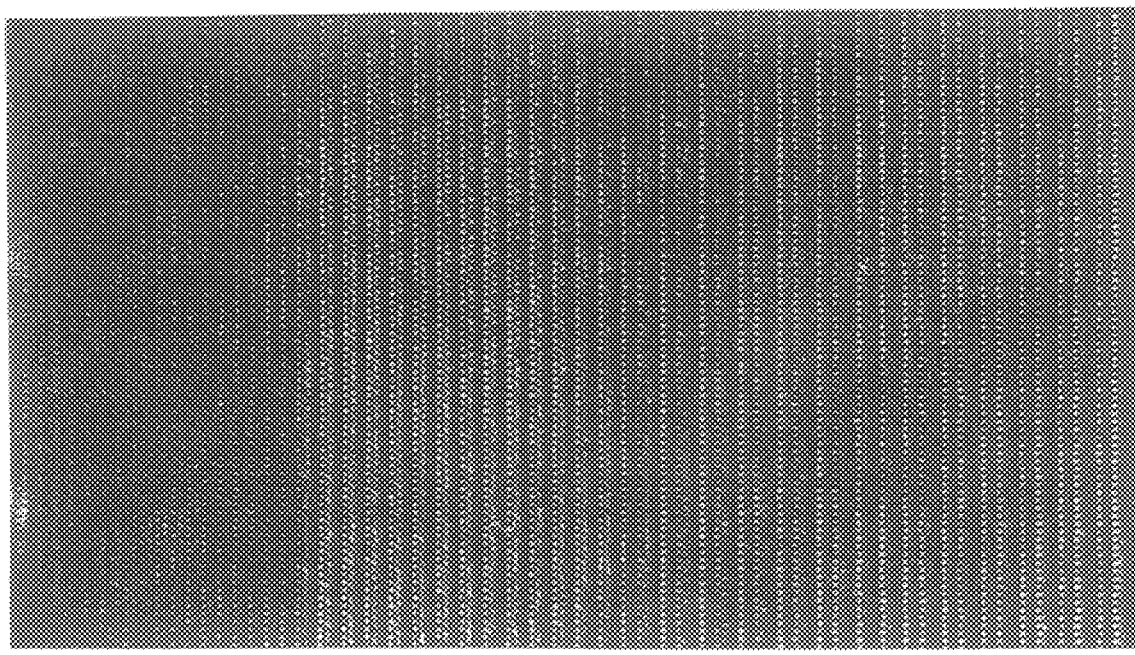
FIG. 4 is a photo showing a lattice image of an electron microscope.

As shown in FIG. 4, the existence of the new $Y_3Ni_4B_4C_3$ substance is also confirmed as well as conventional $Y_1Ni_2B_2C_1$ and $Y_1Ni_1B_1C_1$ phases.

FIG. 5 shows crystalline structures of the $Y_1Ni_2B_2C_1$ and $Y_1Ni_1B_1C_1$ compounds(a and b) and the new $Y_3Ni_4B_4C_3$ substance(c). FIG. 6 shows the crystalline structure of the $Y_3Ni_4B_4C_3$ substance, especially along c-axis.

As shown in FIGS. 5 and 6, the new $Y_3Ni_4B_4C_3$ substance has a laminated structure made up of a half of a $Y_1Ni_2B_2C_1$ unit cell and a $Y_1Ni_1B_1C_1$ unit cell. It is considered from periodicity of the laminated structure that the crystalline structure of the $Y_3Ni_4B_4C_3$ substance belongs to tetragonal system and is a unit cell of the space group I4(No. 79). Consequently, the lattice constants are that a and b are 0.34–0.40 nm and c is 2.500–2.620 nm. If the new substance is not composed of a single phase, for example, by an incidental lamination defect, the crystalline structure will belong to rhombic system because a- and b-axes become unequal to each other. In this case, c-axis of the substance will change 1.250–1.310 nm by a half of 2.500–2.620 nm.

Table 1 shows structural parameters of the $Y_3Ni_4B_4C_3$ substance at room temperature.

TABLE 1

| Atom | Site | x | y | z | $B_{eq}(nm^2)$ |
|---|---|---|---|---|---|
| Y(1) | 2a | 0 | 0 | 0.104(7) | 0.0045 |
| Y(2) | 2a | 0 | 0 | 0.4028(19) | 0.0030 |
| Y(3) | 2a | 0 | 0 | 0.804 | 0.0030 |
| Ni(1) | 4b | 0 | ½ | 0.004(4) | 0.00345 |
| Ni(2) | 4b | 0 | ½ | 0.207(4) | 0.00345 |
| B(1) | 2a | 0 | 0 | 0.253(5) | 0.006 |
| B(2) | 2a | 0 | 0 | 0.546 | 0.006 |
| B(3) | 2a | 0 | 0 | 0.661 | 0.006 |
| B(4) | 2a | 0 | 0 | 0.954 | 0.006 |
| C(1) | 2a | 0 | 0 | 0.305(4) | 0.006 |
| C(2) | 2a | 0 | 0 | 0.604 | 0.006 |
| C(3) | 2a | 0 | 0 | 0.902 | 0.006 |

$B_{eq}$ is the equivalent isotropic thermal parameter.

The numbers in parentheses are statistical uncertainties of the last significant digit.

z for Y(3) (hereafter, abbreviated as $Y(3)_z$) $=1.0-Y(2)_z+Ni(2)_z$. As in the same manner, $B(2)_z=1/2+B(1)_z-Ni(2)_z$; $B(3)_z=1/2-B(1)_z+2*Ni(2)_z$; $B(4)_z=1.0-B(1)_z+Ni(2)_z$; $C(2)_z=0.5+Y(1)_z$; and $C(3)_z=1.0-C(1)_z+Ni(2)_z$.

According to the present invention, new superconductive substances, which have quite different compositions from those of the conventional boron carbide intermetallic compounds, are provided.

These superconductive substances are produced through an easy process of an arc melt method, and therefore the substances have advantage in a forming process such as making wires.

It is needless to mention that the present invention is not restricted to the aforementioned examples.

What is claimed is:

1. A superconductive substance having a nominal composition expressed by the formula $R_3M_{4-x}B_{4-y}C_{3-z}$, where R is at least one element selected from the group consisting of Y, Sc and lanthanide series elements, M is at least one metal element selected from Group VIII of the Periodic Table, $0 \leq x \leq 1$, $0 \leq y \leq 1$, and $0 \leq z < 3$, provided that $z \neq 0$ when $x=y=1$.

2. The superconductive substance as claimed in claim 1, wherein M is more than one element selected from the group consisting of Ni, Pd, Pt, Rh and Ir.

3. The superconductive substance as claimed in claim 1, wherein the superconductive substance has a tetragonal or rhombic crystalline structure.

4. The superconductive substance as claimed in claim 2, wherein the superconductive substance has a tetragonal or rhombic crystalline structure.

5. The superconductive substance as claimed in claim 1, wherein the superconductive substance is a crystal having lattice constants of:

a is 0.34 to 0.40 nm b is 0.34 to 0.40 nm and c is 2.500 to 2.620 nm or 1.250 to 1.310 nm.

6. The superconductive substance as claimed in claim 2, wherein the superconductive substance is a crystal having lattice constants of:

a is 0.34 to 0.40 nm b is 0.34 to 0.40 nm and c is 2.500 to 2.620 nm or 1.250 to 1.310 nm.

7. The superconductive substance as claimed in claim 3, wherein the superconductive substance is a crystal having lattice constants of:

a is 0.34 to 0.40 nm b is 0.34 to 0.40 nm and c is 2.500 to 2.620 nm or 1.250 to 1.310 nm.

8. The superconductive substance as claimed in claim 4, wherein the superconductive substance is a crystal having lattice constants of:

a is 0.34 to 0.40 nm b is 0.34 to 0.40 nm and c is 2.500 to 2.620 nm or 1.250 to 1.310 nm.

9. A superconductive article of manufacture, comprising a superconductive substance having a nominal composition expressed by the formula $R_3M_{4-x}B_{4-y}C_{3-z}$, where R is at least one element selected from the group consisting of Y, Sc and lanthanide series elements, M is at least one metal element selected from Group VIII of the Periodic Table, $0 \leq x 0 \leq 1$, $0 \leq y \leq 1$, and $0 \leq z < 3$, provided that $z \neq 0$ when $x=y=1$.

10. The superconductive article of manufacture according to claim 9, wherein M is more than one element selected from the group consisting of Ni, Pd, Pt, Rh and Ir.

11. The superconductive article of manufacture according to claim 9, wherein the superconductive substance has a tetragonal or rhombic crystalline structure.

12. The superconductive article of manufacture according to claim 10, wherein the superconductive substance has a tetragonal or rhombic crystalline structure.

13. The superconductive article of manufacture according to claim 9, wherein the superconductive substance is a crystal having lattice constants of:

a is 0.34 to 0.40 nm b is 0.34 to 0.40 nm and c is 2.500 to 2.620 nm or 1.250 to 1.310 nm.

14. The superconductive article of manufacture according to claim 10, wherein the superconductive substance is a crystal having lattice constants of:

a is 0.34 to 0.40 nm b is 0.34 to 0.40 nm and c is 2.500 to 2.620 nm or 1.250 to 1.310 nm.

15. The superconductive article of manufacture according to claim 11, wherein the superconductive substance is a crystal having lattice constants of:

a is 0.34 to 0.40 nm b is 0.34 to 0.40 nm and c is 2.500 to 2.620 nm or 1.250 to 1.310 nm.

16. The superconductive article of manufacture according to claim 12, wherein the superconductive substance is a crystal having lattice constants of:

a is 0.34 to 0.40 nm b is 0.34 to 0.40 nm and c is 2.500 to 2.620 nm or 1.250 to 1.310 nm.

* * * * *